US007020852B2

(12) United States Patent
Oeltjen et al.

(10) Patent No.: US 7,020,852 B2
(45) Date of Patent: Mar. 28, 2006

(54) AUTOMATION OF THE DEVELOPMENT, TESTING, AND RELEASE OF A FLOW FRAMEWORK AND METHODOLOGY TO DESIGN INTEGRATED CIRCUITS

(75) Inventors: Bret Alan Oeltjen, Elko, MN (US); Scott Allen Peterson, Bloomington, MN (US); Donald Ray Amundson, New Prague, MN (US); Richard Karl Kirchner, Bloomington, MN (US)

(73) Assignee: LSI Logic Corporation, Milpitas, CA (US)

( * ) Notice: Subject to any disclaimer, the term of this patent is extended or adjusted under 35 U.S.C. 154(b) by 252 days.

(21) Appl. No.: 10/435,168

(22) Filed: May 8, 2003

(65) Prior Publication Data

US 2004/0225972 A1 Nov. 11, 2004

(51) Int. Cl.
*G06F 17/50* (2006.01)
(52) U.S. Cl. .............................. 716/1; 716/4; 706/921
(58) Field of Classification Search ............. 716/1–21; 200/121; 706/921
See application file for complete search history.

(56) References Cited

U.S. PATENT DOCUMENTS

| | | | | |
|---|---|---|---|---|
| 5,553,002 | A * | 9/1996 | Dangelo et al. | 716/11 |
| 5,703,788 | A * | 12/1997 | Shei et al. | 716/4 |
| 6,212,667 | B1 * | 4/2001 | Geer et al. | 716/6 |
| 6,546,524 | B1 * | 4/2003 | Chankramath et al. | 716/4 |
| 6,552,410 | B1 | 4/2003 | Eaton et al. | |
| 6,634,008 | B1 * | 10/2003 | Dole | 716/1 |
| 6,668,360 | B1 * | 12/2003 | Liu | 716/4 |
| 2003/0061581 | A1 * | 3/2003 | Baumgartner et al. | 716/4 |

OTHER PUBLICATIONS

G. Bartels et al., "Flow Management Requirements of a Test Harness for Testing the Reliability of an Electronic CAD System," 1994 European Design and Test Conference, pp. 605-609.*

(Continued)

*Primary Examiner*—Leigh M. Garbowski
(74) *Attorney, Agent, or Firm*—Ojaneu Law Offices (57) ABSTRACT

An automated framework and methodology for the development, testing, validation, and documentation of the design of semiconductor products that culminates in the release of a design kit having a flow manager and flow file to actualize a methodology to design a semiconductor product. The flow framework and methodology receives a methodology and a technology description for the semiconductor product. Then the flow framework and methodology coordinates and tests flow files developed by flow developers using testcases from testcase developers, libraries from library developers and tools from tool from flow developers that may be constantly updated. When a flow file, a testcase, a library, and/or a tool is updated, added, or otherwise changed, ongoing regression testing is accomplished to update the correct flow file. The flow framework and methodology creates a sequence of flows to design the semiconductor product, and each flow, when properly executed, results in a set of deliverables that are input to the next flow. The flows include not only the evolution of the design from a high-level behavioral description to a physical implementation, but also the verification of the specified functions and of manufacturability. Delivered to the customer is a design kit having the tested and validated flow files, along with the flow manager that executes the flow files. Using the design kit, a designer of a semiconductor product can input her/his chip specification; output will be final testable and verifiable design views for a manufacturing facility of the semiconductor product.

11 Claims, 8 Drawing Sheets

OTHER PUBLICATIONS

M. Caron et al., "Mask Cycle Time and Serviceability Improvement Through Capacity Planning and Scheduling Software," 1997 IEEE/SEMI Advanced Semiconductor Manufacturing Conference, pp. 58-61.*

E. Siepmann, "A Data Management Interface as part of teh Framework of an Integrated VLSI-Design System," IC-CAD-1989, pp. 284-287.*

* cited by examiner

AUTOMATION OF THE DEVELOPMENT, TESTING, AND RELEASE OF A FLOW FRAMEWORK AND METHODOLOGY TO DESIGN INTEGRATED CIRCUITS

FIELD OF THE INVENTION

This invention relates generally to the field of electronic circuit design and more particularly relates to a total environment for designing integrated circuits.

BACKGROUND OF THE INVENTION

Transistors are electronic components that amplify a signal, or open or close a circuit. Joined together, transistors perform Boolean logic functions like AND, OR, NOT, NOR, and are called gates. Integrated circuits consist of transistors and the interconnections between them that perform specific functions. Integrated circuits, the interconnections, and transistors embedded in a semiconducting material are called semiconductor chips or chips. Integrated circuits and chips have become increasingly complex with the speed and capacity of chips doubling about every eighteen months. This increase is the result of, inter alia, advances in design software, and fabrication technology, semiconductor materials, etc. An increased density of transistors per square centimeter and faster clock speeds, however, make it increasingly difficult to design and manufacture a chip that performs as actually specified. Unanticipated and sometimes subtle interactions between the transistors and other electronic structures may adversely affect the performance of the circuit, which in turn increase the expense and risk of designing and fabricating chips, especially custom designed chips for a specific application. Yet, the demand for complex custom-designed chips increases with the variety of microprocessor-driven applications and products. Without an assured successful outcome within a specified time, fewer organizations are willing to attempt the design and manufacture of custom chips.

The challenge of designing complex integrated circuits has been met by introducing more powerful specialized software tools intended to design chips correctly and efficiently. As the software tools evolve, however, they become increasingly complicated, requiring more time to master and use them. Correspondingly, the cost of staffing, training, and coordinating personnel to perform the various aspects of chip design also increase. One general response to this dilemma has been a call for higher levels of abstraction, which simply means that the logical entities with which designers work are standardized and encapsulated like black box functions within the design. Although this abstraction has characterized the semiconductor industry throughout its history, the software tools used in chip design today are so complex that it is difficult to adapt them to this higher level of abstraction. There are several reasons for these difficulties, one of which is that the customers' different needs and specifications for integrated circuits must be aligned with standard and proprietary tools and capabilities of both designers and fabrication facilities.

To streamline a complicated process, any organization engaged in designing semiconductor chips first creates a methodology for doing so. Such a methodology comprises an ordered assembly of all of the tasks and tools required. For example, one part of the design methodology might specify tools and procedures to be used in designing the clocks, another for packaging, yet another for timing-closure, another for signal integrity and power for a chip with, e.g., over forty million transistors. The design methodology, moreover, must be updated frequently because technologies and requirements change, for instance, a new technology may require a different percentage of a different metal on a particular layer of the chip, so the methodology would be updated with a step to insert that metal layer in the specified areas of the chip. There are a myriad of other reasons to update the design methodology, such as to improve turnaround time, or to design a very large circuit.

The development of a methodology for the design of custom semiconductor chips requires the coordinated expertise of dozens of specialists whose work must be tracked and secured, integrated with the work of others, and tested. Until now, the design methodology has been essentially numerous documents having manual instructions for designing a chip to satisfy a customer's specification and the requirements for a technology and a fabrication facility. Each fabrication facility, it should be noted, operates with different design rules, equipment, molds, recipes and standards, all of which should be considered early in the process for best practices because they have implications for the final work product. The final methodology to design the chip, therefore, must match the tools that will be used to fabricate the chip, and be testable at various phases in the manufacturing process.

Figure 1:
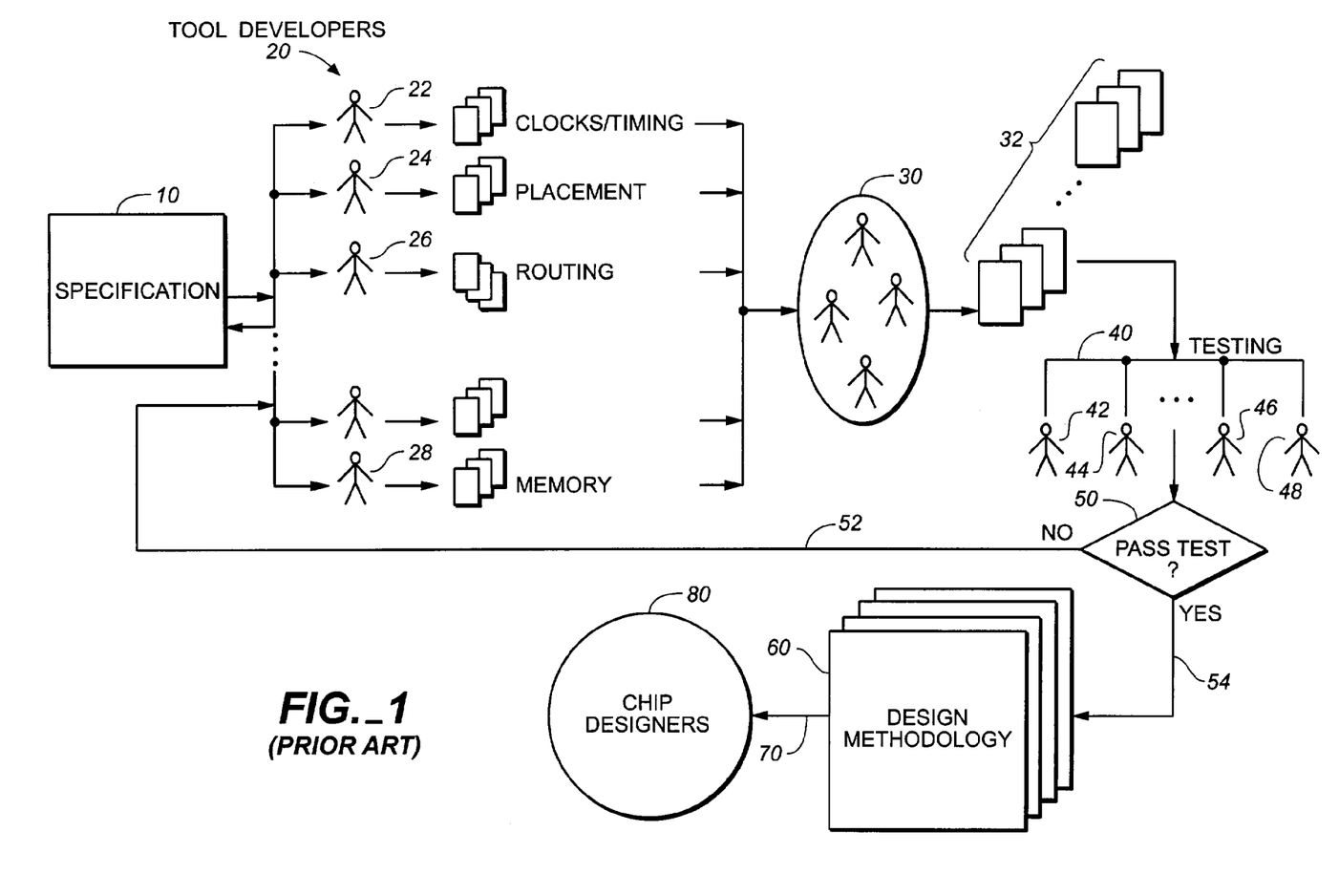
FIG. 1 is a flowchart describing a prior art method of developing designs of and methodology of designing semiconductor chips.

FIG. 1 represents the current state of the art for creating and/or updating a design methodology for designing a semiconductor chip. The process begins with a structured list of requirements for the new and/or updated design, called a specification 10. The specification 10 is divided into component problems and subproblems and sent to many, e.g., fifty, procedure or tool developers 20 working simultaneously and, most likely, isolated from one another. For example, one developer 22 may write procedures to specify how to design and test clock functions. The procedure for a clock function might, for example, call for a clock tool, request the chip designer to select various options, access files, and then execute the clock tool. Yet another developer may write procedures to create high-fan out nets; while other developers 24, 26, 28 write procedures to create input/output (I/O) rings; or place critical logic; reconnect scan chains; etc. Developers 20 are, moreover, continually testing these separate procedures; for example, a tool developer who writes code to insert a clock would test the code by running clocks at different frequencies, etc. The important aspect to remember, however, is that often these tool developers 20 are isolated from other tool developers 20, and thus while a tool may be internally consistent, once it is combined with the other tools, collectively, the tools may not yield correct results.

There are many problems inherent in this simultaneous development process. One problem, besides the isolation, is that typically tool developers do not know how the whole process is organized so that each developer is required to make many assumptions to complete her/his part of the design. More likely than not, these assumptions are not valid but won't be tested until later in the process. Another problem stems from the need for developers to use third-party commercial software with in-house or a customer's proprietary software tools. These tools are often written in different languages and frequently change because errors in the tools are found and fixed. In such a specialized and fast-changing environment, communication of errors and corrections is critical but difficult to actualize. Flawed tools and inconsistent versions of tools cause an erroneous design methodology but one whose flaws are not evident until later in the process.

Returning now to FIG. 1, all procedures written by the individual developers are typically stored, tracked, and secured until they are complete. When complete, at step 30, the procedures are combined by yet another isolated group of design architecture specialists into a methodology document 32 having hundreds of pages of descriptions of design procedures and sub-procedures.

The methodology document 32 is then sent for testing at step 40. Testing on the methodology document 32 is done manually, typically by several testers 42, 44, 46, 48, also isolated, using sample designs as testcases that make demands on the design methodology document 32. Initially, the testcases are simple ones that make modest demands on a design methodology document 32 but the testcases increase in complexity and speed through larger and more complete designs/testcases. Testers 42-48 are looking for the whole methodology document 32 to work so that all individual procedures culminate in a reliable design process. If the design methodology document 32 fails, as in step 50, notifications are sent to the developers 20, as in step 52, who then debug and correct the specification and/or individual tools. The correction is then recombined with the other development tools and the whole design methodology is tested again. Generally, what really happens is that one developer may fix her/his tool, only to cause another tool to fail testing. Distributing these dozens of files of the design methodology document 32, compiling test results, managing changes to the files and the methodology, the tools, etc. must be meticulously tracked. Right now, all this is done manually and is understandably prone to many mistakes, both human and resulting from the interactions of the many components of the design methodology contained within methodology document 32. In fact, more errors result from tools failing to interact properly with one another and because of the erroneous, albeit necessary, assumptions of the tool developers than from flaws in the logic of the methodology, yet both types of errors require debugging. Testing in this way is time consuming and awkward. Writing, combining, testing, rewriting, recombining, retesting, rewriting, recombining, retesting, without a doubt, is a tedious and expensive process.

The final design methodology document 60 consists of all the step-by-step processes involved in designing a specific chip. The design methodology document 60 may be more than 500 or even 1,000 pages in length. In a document of this complexity, it is difficult if not impossible to identify and resolve inadvertent inconsistencies and ambiguities that cause misinterpretations and errors. Such flaws are time-consuming and costly to test and rework. The design methodology document 60 may be released, as in step 70, to customers and designers 80 or to those who determine whether a customer's specifications for a semiconductor chip can be met. In either case, many people not involved in the development of the design methodology document 60 must read and understand it to design their chip. Because of the time pressures to design chips quickly and the tediousness of manually following these procedures, sections of the design methodology can be automated by scripting. Scripting, however, still requires considerable manual effort because it is a listing of procedures that are manually input.

There is thus a need in the industry for a method to automate and coordinate the development, the testing, and the release of the many tools required to create a flow methodology in the design of integrated circuits.

SUMMARY OF THE INVENTION

These needs and others are satisfied by a method to automate the development of flows for the design of semiconductor products, comprising the steps of: inputting a specification of a methodology; inputting a plurality of resources used in the design of semiconductor products; inputting a sequence of steps to be undertaken to coordinate the interaction of the resources and the specification for the design of semiconductor products; executing the sequence of steps; testing the sequence of steps; and saving those sequences of steps that pass testing. If the sequence of steps fails testing, then the invention contemplates that the steps can be modified. The resources involved in the design of the semiconductor products may also be modified if the sequence of steps fails testing. The state of any of the sequence of steps can be saved during execution and/or testing. During execution and/or testing, the steps of the sequence can be paused at any step. Once execution and/or testing are resumed, then the saved state can be restored. The resources used in the design of semiconductor products may include tools and/or libraries and/or testcases. The execution and/or the testing of the sequence of steps can be allocated to multiple processors, and the results will be merged.

The invention may further be considered a flow manager to execute a sequence of steps used in the design of semiconductor product, the flow manager comprising: a capability to understand and translate a plurality of resources in one of a plurality of programming languages to another of a plurality of programming languages; and a capability to determine and obtain the proper and necessary data required for each of the plurality of resources as it is invoked during execution of a flow and/or a test used in the design of semiconductor products. The flow manager may further comprise the capability to distribute the execution of a flow and/or a test to multiple processors connected on a network and then to recombine the results. The flow manager may also comprise the capability to save the state of a flow and/or a test during execution; and then to restore the state of a flow and/or test upon continued execution.

The invention may also be a design kit for use in automating the design of semiconductor products, comprising: a plurality of testcases; one or more flow files having a sequence of steps to be undertaken during the design of the semiconductor products; a plurality of resources required by the flow files; a flow manager to execute the flow files and to coordinate the plurality of resources; and a tester to call appropriate testcases to the flow files.

BRIEF DESCRIPTION OF THE DRAWINGS

The novel features believed characteristic of the invention are set forth in the claims. The invention itself, however, as well as a preferred mode of use, objects and advantages thereof, will best be understood by reference to the following figures and their detailed description:

DETAILED DESCRIPTION OF THE INVENTION

Figure 2:
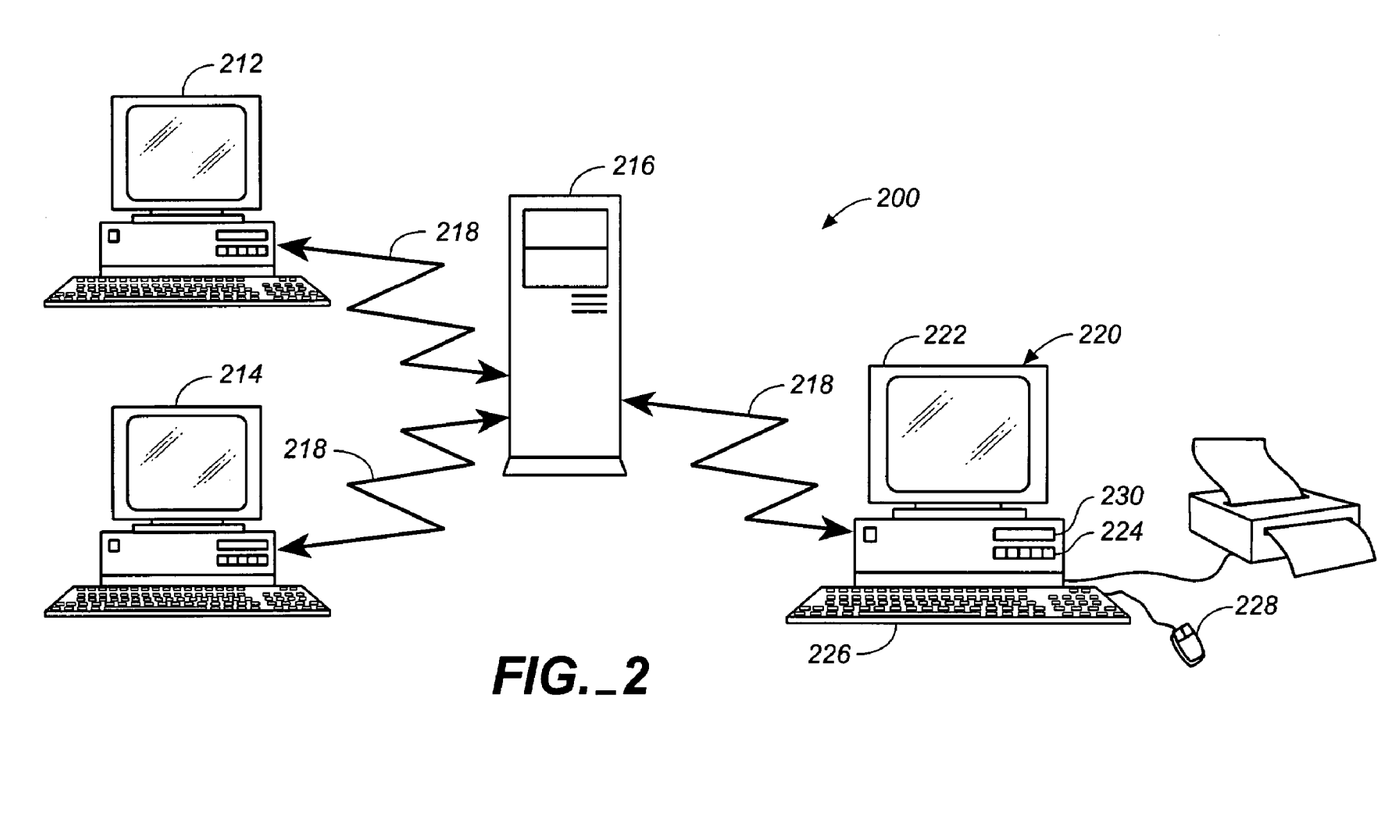
FIG. 2 is a simplified block diagram of a networked computer system in which the method and the tool of the invention can be implemented.

Referring to the drawings, FIG. 2 illustrates an exemplary computer system 200 upon which a flow framework and methodology as disclosed herein could be installed and/or used. Computer system 200 is illustrated as a networked computer system that includes one or more client computers 212, 214 and 220 such as workstations coupled through a network 218 to a server 216. Server 216 could also be a personal computer-based server, a minicomputer, a midrange computer, or a mainframe computer. It will be appreciated, moreover, that some servers 216 do not support direct user input and output. While shown here as a point-to-point connection, computers 212 and 214 need not be coupled to server 216 directly, but may be coupled to yet another network which in turn is connected to server 216. Network 218 may represent practically any type of networked interconnection including but not limited to local-area, wide-area, wireless, and public networks such as the Internet, and any number of routers and hubs connected in between, e.g., a local-area network to a wide-area network to the Internet through a series of routers and/or other servers. Any number of computers and other devices may be networked through network 218 to comprise the computer system 200.

For the purposes of the invention, computer 220 may represent practically any type of computer, another computer system, or other programmable electronic device, including a client computer similar to computers 212, 214 and 220 of FIG. 2, a server computer, e.g., similar to server 216 of FIG. 2, a portable computer, an embedded controller, a hand-held device, etc. Computer 220 may be coupled in a network as shown in FIG. 2 or may be a stand-alone device, typically a workstation. Computer 220 will hereinafter also be referred to as a computer although it should be appreciated that the term "computer" may also include other suitable programmable electronic devices capable of allowing a chip designer to access the methodology and data base of the methodology in order to develop and/or modify the flow or its development thereof.

Workstation 220 typically receives a number of inputs and outputs for communicating information. For interface with a user or operator, workstation 220 typically includes one or more user input devices 226, 228, e.g., a keyboard, a mouse, a trackball, a joystick, a touch pad, and/or a microphone, among others, and a display 222 such as a CRT or flat panel monitor, an LCD display panel, and/or a speaker, among others. For additional storage, workstation 220 may also include one or more mass storage devices 360, e.g., a floppy or other removable disk drive 224, 230, a hard disk drive, a direct access storage device, an optical drive, e.g., a CD drive, a DVD drive, etc., and/or a tape drive, among others, that may be connected directly or may be connected through a SAN or other network. Workstation 220 may further include an interface connected to one or more networks 218, e.g., a local-area network, a wide-area network, a wireless network, and/or the Internet, among others, to permit communication of information with other computers coupled to the network. Workstation 220 typically includes suitable analog or digital interfaces between processor 300 and each of the components 218, 222, 226, 228, and 360 as is known in the art.

Figure 3:
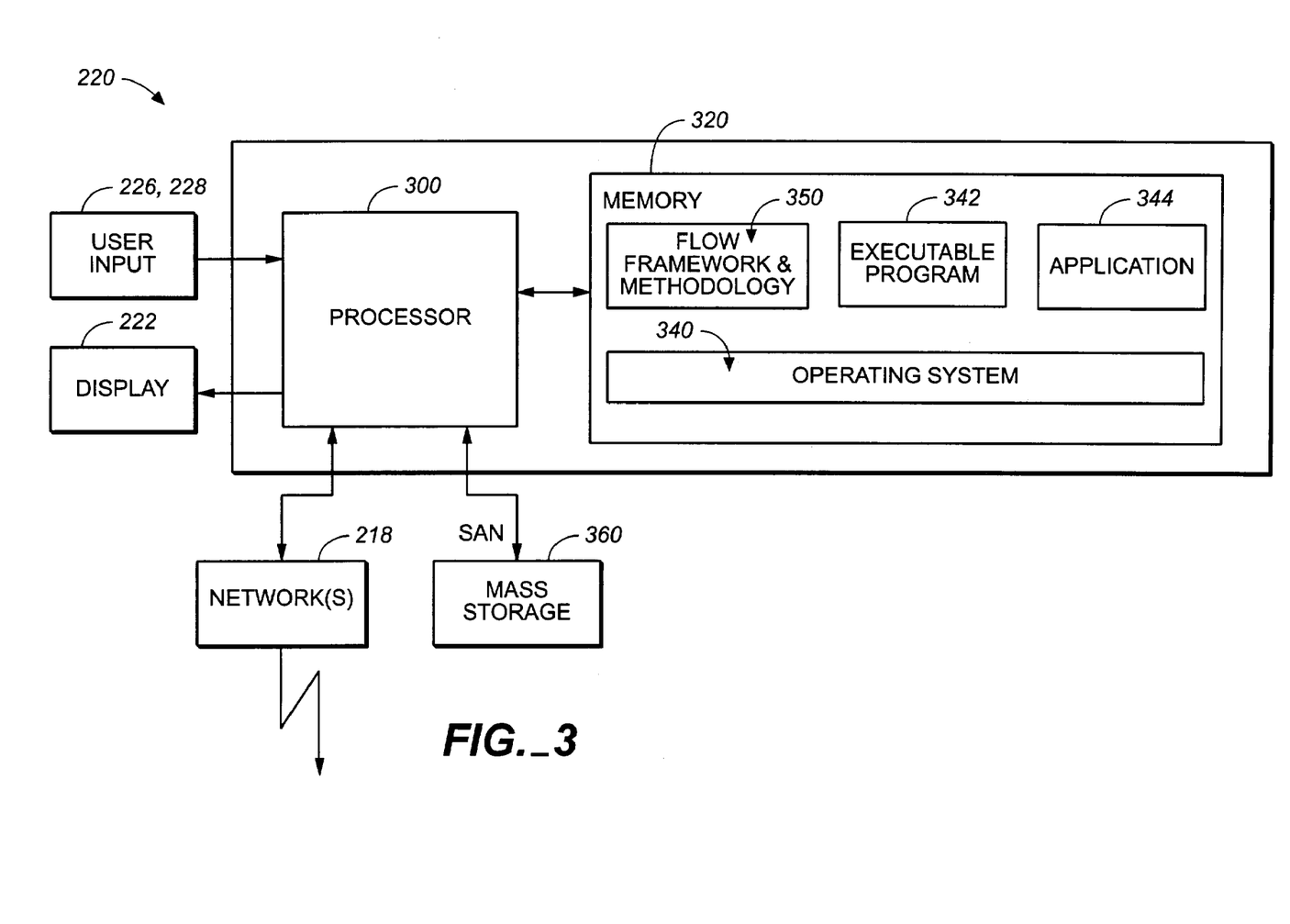
FIG. 3 is a simplified block diagram of a computer workstation to which a tool, test, and/or chip developer may access and use the flow framework and methodology in accordance with an embodiment of the invention.

With reference to FIG. 3 wherein the flow framework and methodology or separate portions thereof for developing, testing, and automating a methodology to design integrated circuits, and/or creating, testing, and designing integrated circuits during chip design as disclosed herein is installed as at least one or more applications on computer workstation 220. Computer workstation 220 typically includes at least one processor 300 coupled to a memory 320. Processor 300 may represent one or more processors or microprocessors and memory 320 may represent the random access memory (RAM) devices comprising the main storage of computer 300, as well as any supplemental levels of memory such as cache memories, nonvolatile or backup memories, programmable or flash memories, read-only memories, etc. In addition, memory 320 may be considered to include memory storage physically located elsewhere in workstation 220, e.g., any cache memory in a processor 300, as well as any storage capacity used as a virtual memory, e.g., as stored on a mass storage device 360 coupled to workstation 220 with a storage area network (SAN) or on another computer coupled to workstation 220 via network 218.

Workstation 220 operates under the control of an operating system 340 such as a UNIX-based or WINDOWS-based operating system but is not so limited by any particular operating system. The operating system 340 provides, inter alia, functions such as device interfaces, management of memory pages, management of multiple tasks, etc. as is known in the art. Operating system 340 also executes various computer software applications 344, components, programs 342, objects, modules, etc. One of the applications 344 may include the flow framework and development methodology 350 or separate portions thereof which may reside in memory 320, although it need not, in which case workstation 220 and its processor 300 may access the flow framework and methodology 350 or other portions thereof, the required data and many of the accessed tools, other various applications, components, programs, objects, modules, etc., through network 218 in a distributed or client-server computing environment whereby the processing to implement the functions of the flow development framework and methodology 350 may be allocated to multiple computers over a network, such as the Internet. In general, the routines executed to implement the embodiments or portions of the flow framework and methodology 350, whether implemented as part of an operating system or a specific application, component, program, object, or sequence of instructions will be referred to herein as the flow framework 350. The flow framework 350 typically comprise one or more instructions that are resident at various times in various memory and storage devices in a computer system, and that, when read and executed by one or more processors in a computer system 200, cause a particular processing device to perform the steps necessary to execute steps or elements embodying the various aspects of the flow framework 350.

Those skilled in the art will appreciate that the various embodiments and aspects of the flow framework 350 are capable of being distributed as a program product in a variety of forms, and that the invention applies equally to all signal bearing media used to actually carry out the distribution. Examples of signal bearing media include but are not limited to recordable type media such as volatile and non-volatile memory devices, floppy and other removable disks, hard disk drives, optical disks, e.g., CD-ROM's, DVD's, etc., among others, and transmission type media such as digital and analog communication links. In addition, various programs described hereinafter may be identified based upon the application for which they are implemented in a specific embodiment of the invention. Any particular program nomenclature that follows is used merely for convenience, and thus the invention should not be limited to use solely in any specific application identified and/or implied by such nomenclature. The illustrated embodiments are not intended to limit the present invention. Indeed, those skilled in the art will recognize that other alternative hardware and/or software embodiments may be used without departing from the scope of the invention.

Figure 4:
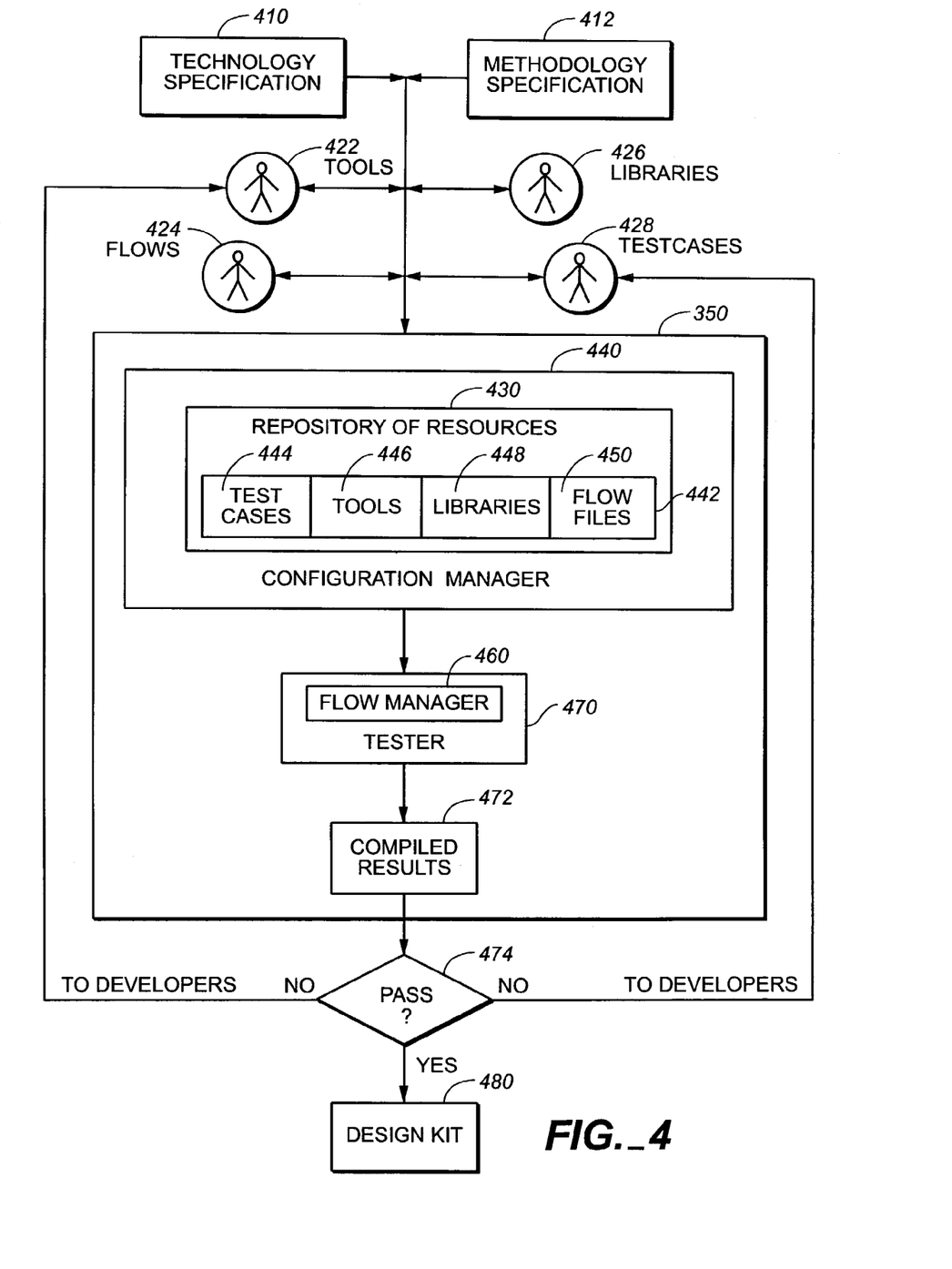
FIG. 4 is a flowchart describing the design and release of the flow in accordance with an embodiment of the flow framework and methodology described herein. It is suggested that FIG. 4 be printed on the face of the patent.

A simplified process by which the flow framework 350 can create a methodology and/or flow for designing integrated circuits, and for testing both the flow and the resultant designs is shown in FIG. 4. The flow framework and methodology 350 creates and coordinates interactions between the design, testing tools, libraries, testcases, and their respective methods that typically span multiple developers across multiple locations. The flow framework 350 further automates and not only increases the reliability and efficiency of many steps, but also prevents flaws, errors and miscommunication. The flow framework 350 has at least three components: (a) a flow manager 460 that operates throughout the framework 350 to execute the flow files 450 thereby unifying the design environment; (b) a configuration manager 440 to organize and secure myriad individual flow files 450 and other resources 442 in a repository 430; and an (c) automated tester 470 having regression test scripting to organize and execute the testing process. The output from the flow framework 350 is a design kit 480 that automates and coordinates the interaction of all the necessary resources to design a semiconductor chip and/or product.

When a new design kit 480 or an update to an existing design kit 480 for the design of a semiconductor product is required, a technology specification 410 and a methodology specification 412 is input into the flow framework 350. The technology specification 410 may specify such requirements as the number of logic gates, the speed of the circuit, the number and types of semiconductor and/or metal layers, etc. of the product. The technology specification 410 may further state the technology of the final semiconductor product, e.g., CMOS, bipolar, GaAs, 0.18 micron, 0.13 micron, etc., and other aspects of semiconductor technology used by those of skill in the art. The methodology specification 412 sets the goals or requirements for the design process, such as, for example, it may require a technique to incorporate a new layout or a new technology of diffused memory, I/O cells, configurable I/O cells, and/or hardmacs onto a chip. The methodology specification 412 may further require a method to design a custom chip from a first customer netlist to final release of data to mask-makers in a specified time period. Other aspects of the methodology specification 412 may further state the file format of the register transfer logic (RTL) used and/or desired; i.e., whether the flow framework will work with both VHDL or Verilog or both, and/or what milestones are required in the design, such as when information provided to the fabrication facility is required, and/or performance criteria, such as the time required to run an individual tool and/or the time required to run an entire flow. Other requirements can be added to the methodology specification 412, and those of skill in the art will recognize the usefulness of the methodology specification 412.

The technology specification 410 and the methodology specification 412 may be input to various developers 422–428, among whom are tool developers 422, experts in the many tools required for chip design, e.g., clocks, packaging, power, timing-closure, signal integrity; library developers 426 who write libraries of interactive logic from which the chip is composed; testcase developers 428 who write the sample designs to incrementally challenge the design methodology; and of course, the flow file developers 424 who write the procedures or flow that automate the design of the chip. All or some of these resource developers 422–428 may review the specifications and may amend the specifications, if necessary, and/or select, update, or write new procedures for using new or existing tools and submit these new resources 442 to the flow framework 350. By way of example only, one or more tool developers 422 expert in the area of packaging the ceramic or plastic housing of a chip may revise the flows and/or tools that determine the number and position of the I/O buffer cells by adding steps, calling new, updated tools, or establishing new options. Testcase developers 428 may also review the technology specification 410 and the methodology specification 412 to create and/or update testcases, which are sample designs that are submitted to the flow framework 350 and become part of the design kit 480.

Operating throughout the flow framework 350 is the flow manager 460, which essentially executes the flow files 450. Resource developers 422–428 preferably use the flow manager 460 to write and revise procedures to be included in the final flow framework and design kit 480. Flow manager 460 uses a flow description language having syntax similar to tool control language (Tcl) for describing flows. Tcl is an industry-standard scripting language available as freeware that allows step-by-step control of complex tools, but the flow manager 460 could also use other languages. In contrast to the prior art of FIG. 1 that produces documentation of a manual design methodology, flow manager 460 actually produces executable flow files 450, also called flows, that interact with the testcases 444, the libraries 448, and the tools 446, and any other required resources 442. Features of flow manager 460 may be understood further by reference to the sample flow read and executed by the flow manager 460 presented below.

---

1. -flow { # start attributes
2. -name MyFlow
3. -desc "This is a sample flow to test features"
4. -doc "This flow is used to test many of the features of a flow manager program."
5. -owner "Jan Doe"
6. -language tcl
7. -init_lvars {
8. memory 0
9. mylist ""

-continued

```
10. }
11. } { # Start parameters
12. } { # Start flow statements
13. ###-----------------------------------------------------
14. flow_initialize { } {
15. flow_print "My Flow Initialize (Tcl)"
16. proc SampleProc { } {
17. flow_print "SampleSubroutine"
18. }
19. }
20. ###-----------------------------------------------------
21. flow_step { -name Step1 } {
22. flow_print "Step: [flow_step_name]"
23. set memory 6
24. flow_print "Data: [flow_csh_exec ls]"
25. }
26. ###-----------------------------------------------------
27. flow_invoke { -name Step1x } { } MyFlow2
28. ###-----------------------------------------------------
29. flow_step { -name Step2 } {
30. flow_print "Step: [flow_step_name]"
31. if { [flow_outdated -input files/demo.flow -output files/demo.flow.backup]
32. } {
33. flow_print "Copying File: files/demo.flow -> files/demo.flow.backup"
34. flow_exec [list cp files/demo.flow files/demo.flow.backup]
35. }
36. }
37. ###-----------------------------------------------------
38. flow_step { -name Step3 } {
39. flow_print "Step: [flow_step_name]"
40. flow_print "Memory: $memory"
41. for {set i 0} {$i<5} {incr i} {
42. lappend mylist $i
43. }
44. }
45. ###-----------------------------------------------------
46. flow_step { -name Step4; -language python } {
47. flow_print("Step: %s"%(flow_step_name))
48. flow_print("Memory: %d",int(memory))
49. flow_print("List:")
50. for i in flow_tcl_to_list(mylist):
51. flow_print(" %s"%i)
52. }
53. ###-----------------------------------------------------
54. flow_if { -name Step5 } { 1 } {
55. flow_step { -name Step1 } {
56. flow_print "Step: [flow_step_name]"
57. flow_print "Yes"
58. flow_print "Length: [llength $mylist]"
59. foreach i $mylist {
60. flow_print " Item: $i"
61. }
62. }
63. } flow_elseif { 0 } {
64. flow_goto { -name Step2 } Step6
65. } flow_else {
66. flow_goto { -name Step3 } Step7
67. }
68. ###-----------------------------------------------------
69. flow_return { -name Step6 }
70. ###-----------------------------------------------------
71. flow_step { -name Step7 } {
72. flow_print "Step: [flow_step_name]"
73. }
74. ###-----------------------------------------------------
75. flow_foreach { -name Step8; -lvar ivar; -values { 0 1 2 3 4 } } {
76. flow_step {-language python } {
77. flow_print("LoopVar: %s"%ivar)
78. }
79. }
80. ###-----------------------------------------------------
81. flow_foreach { -name Step9; -concurrent; -lvar ivar; -values { 0 1 2 3 4 } } {
82. flow_step {-language python } {
83. flow_print("LoopVar: %s"%ivar)
84. }
85. }
```

-continued

```
86. ###-----------------------------------------------------
87. flow_while { -name Step10 } { $memory > 0 } {
88. flow_step { -name Step11 } {
89. flow_print "Memory: $memory"
90. decr memory
91. }
92. }
93. ###-----------------------------------------------------
94. flow_group { -name Step12; -concurrent } {
95. flow_step { -name Step13 } {
96. flow_print "Step13"
97. }
98. flow_step { -name Step14 } {
99. flow_print "Step14"
100. }
101. }
102. ###-----------------------------------------------------
103. flow { -name MyFlow2; -language python } { } {
104. flow_initialize { } {
105. flow_print("MyFlow2 Initialize (Python)")
106. def SampleSubroutine( ):
107. flow_print "SampleSubroutine"
108. }
109. flow_step { -name Step1 } {
110. flow_print("Step: %s"%flow_step_name( ))
111. flow_print("Data: %s"%flow_csh_exec("pwd"))
112. }
113. }
114. flow_top {} MyFlow
```

Flow manager 460 has many excellent features, one of which is that it supports specialized tools in other languages, including but not limited to Tcl, Python, Avanti-Scheme, Avanti-Python, Dolphin-Tcl, Dolphin-Python and other freeware and/or commercial or proprietary languages. In this particular flow above, lines 1 through 81, the default language as established in line 6, is Tcl, although the default language can be overridden, as in line 46 that sets forth Python as the language for Step4. Indeed, the subflows that may be invoked may be written in different languages from the main flow, e.g., MyFlow2, in Python as invoked in line 103.

Flow manager 460 is capable of calling tools necessary to complete a task. For instance, the flow_exec command on line 34 of the sample, flow_exec [list cp files/demo.flow files/demo.flow.backup, calls the standard UNIX "cp" command to copy a file. The same execute command, flow_exec, would, of course, call tools listed, including, for instance, the specialized tools used to configure and/or place semiconductor chip components such as clocks, I/Os and memory, e.g., one of the suite of generation tools, as disclosed in copending U.S. patent application Ser. No. 10/318,623 filed 13 Dec. 2002 entitled Automated Selection and Placement of Memory During Design of an Integrated Circuit; copending U.S. patent application Ser. No. 10/334,568 filed 31 Dec. 2002 entitled Placement of Configurable Input/Output Buffer Structures During Design of Integrated Circuits; and copending U.S. patent application Ser. No. 10/335,360 filed 31 Dec. 2002 entitled A Simplified Process to Design Integrated Circuits, commonly owned by the assignee herein and incorporated by reference in their entireties.

Flow manager 460 also embeds the documentation within the flow itself. For example, at lines 3 and 4, a description and documentation of the flow is presented. This self-documentation feature ensures that documentation of the procedure/flow is synchronized and up-to-date with the procedure itself.

Yet another very useful feature of the flow manager 460 is its ability to preserve the state of a flow using a suspend saving resource. This suspend saving resource permits a user to pause and/or exit and restart a flow if necessary and return to the same flow step and state, provided the same step still exists in the flow. Updated flow steps, moreover, can be reloaded into the flow when the flow is in the paused state. Without this feature and given that flows may call hundreds of tools and take weeks to execute, any change or disability of the executing computers would require starting the process again. Flow manager 460 further retains the values of certain variables between executions of the flow files 450. These persistent variables may store design-related information needed by the flow. In lines 7 and 8, a persistent variable with the name "memory" is declared and initialized with the value zero. See line 23 of the sample, set memory 6, which sets the persistent variable named "memory" to the value 6. In lines 40, 87, and 89 in Tcl and line 48 in Python, memory variables are shown to be available in other scripting languages.

To fix or debug failed flows, resource developers 422–428 can take advantage of several debug features of the flow manager 460, specifically commands that permit stepping through and editing code such as step, next, run, continue, as well as pause, stop or kill a task. The flow manager 460 also gives a flow developer 424 or other user full control over the location within the flow to manually set the current flow step and/or to establish flow nesting.

Flow manager 460 also supports a hierarchy of other flows or subflows; i.e., one flow can call or invoke other flows, which may be in the same or different source files, such as by using a flow_invoke command of line 27 above, flow_invoke {-name Step1$x$} { } MyFlow2 Flow manager 460 supports simple flow control structures similar to programming languages. These control flow structures enable another very useful feature of flow manager 460 to support forking and merging of processes so that, for example, a partitionable step may be distributed to and executed on multiple processors, and then merged when complete. In addition, control of the flow while running is allowed so that a user or program interface is available for control of the flow while running a particularly long and demanding task, so a user can manually set the current flow step and the flow nesting. Such flow control structures include: if/else statements, goto statements, subroutine call/return, blocks of steps. Each flow task statement has a list of names of attributes and the attributes may or may not have values. The value of an attribute, if any, is in the native language format. Attribute expressions, however, are not evaluated until runtime. A flow statement and a flow_invoke statement also have parameters that always have values, and are given in the same format as attribute expressions. Again, the parameters expressions are not evaluated until run-time. Below are the names and a simplified description of exemplary flow statements within flow manager 460.

flow The flow statement starts a flow. A flow is a sequential order of tasks. Flows have a set of parameters with default values. These default values can be replaced with other values when the flow is called. Flows exist at the top level in a file.

flow_group The flow_group statement starts a group of statements. If the flow_group statement contains the -concurrent attribute, lines 94–101, the steps within that group are executed as parallel processes simultaneously. When all the steps have finished executing, the flow group is exited. This provides flow control for forking and merging. Grouping statements is useful when running the debugger because the entire group can be stepped run to completion. The statements allowed within a group are the same as the statements within a flow or flow_if code block.

flow_step The flow_step is the simplest task type that comprises native commands of an interpreter, e.g., Tcl or Python. The code within the interpreter will be executed in a separate process, data saved in the persistent variables will be saved. This is the smallest level step that the manager can execute. This command facilitates debugging.

flow_if The flow_if statement branches the flow and is evaluated in a separate process as a native expression based on the -language attribute. The expression is expected to return a true or a false value. This is followed by a group of executable statements.

flow_goto The flow_goto statement branches the flow to another specified statement. The destination of the goto is searched starting in each of the parent groups defined in the flow, thus the full pathname is not required. Preferably, a flow_goto cannot jump into or out of a flow_foreach or flow_while loop, nor can it jump across sections marked as concurrent.

flow_invoke The flow_invoke statement calls another flow, but only top level flows can be invoked. The flow is found by searching the list of all the top level flows. An invocation is terminated by either a return task statement, or by reaching the end of the task/flow that was invoked. Parameter values on the invoke statement override the default parameter values for the flow.

flow_return The flow_return statement exits a flow. An input parameter can be used to specify the name of a flow variable that can be set as the returned value.

flow_foreach The flow_foreach statement iterates across a set of values. A loop variable is created as a local variable, having a name specified with the -lvar attribute. The list of values of the iteration is specified with the -values attributes. The flow_foreach statement contains a group of executable statements that are executed for each value in the loop. See lines 75–85. If the flow_foreach statement contains the -concurrent attribute then the _foreach group of statements are executed as parallel processes simultaneously, see lines 81–85.

flow_while The flow_while statement first determines if a condition is true or false, and so long as a condition is true, execution of the following group of statements will be repeated. See lines 87–92.

flow_continue The flow_continue statement advances to the next iteration within a flow_foreach or flow_while loop. A flow_continue statement cannot be used within a flow_foreach loop that has the -concurrent attribute.

flow_break The flow_break statement exits from a flow_foreach or flow_while loop. A flow_break statement cannot be used within a conrrent flow_foreach loop that has the -concurrent attribute.

flow_source The flow_source statement includes another flow description file within the text of the flow file as if the content were in this file. This is similar to an include statement in the C programming language.

flow_top The flow_top statement specifies the main flow within a flow description file. If there is no flow_top statement within the top flow file, the last flow in the file will be used as the top flow.

flow_initialize The flow_initialize statement specifies code that executes at startup of the flow manager within the main process; flow_initialize also preloads language interpreters with native subroutines. See examples at line 16–18 for Tcl native subroutines and see lines 106–107 for a sample Python native subroutine.

As flow developers 424 finish writing or updating flow files 450 using the commands above, they submit the flow files 450 to the common repository 430. The repository 430 contains all the resources 442 necessary to execute a flow file 450 including but not limited to updated testcases 444, tools 446, libraries 448, all of which are managed by the configuration manager 440 so that the most recent and tested versions are accessible for use in flows. The configuration manager 440 provides, inter alia, check-in/check-out security; file version control; and coordination of the repository 430 and its resources 442, as is known in the art. Preferably, the configuration manager 440 has a client/server web-based architecture with the capability to cache files locally for quick access to allow many developers across many locations to work in parallel. A variety of configuration managers 440 are commercially available, such as SYNCHRONICITY DesignSync, but a commercial configuration manager may have to be modified and/or carefully installed to meet the needs of the flow framework and methodology 350. For instance, the configuration manager 440 may be supplemented by scripting to automate some tasks, limit options, standardize tags, and enforce usage style.

Figure 5:
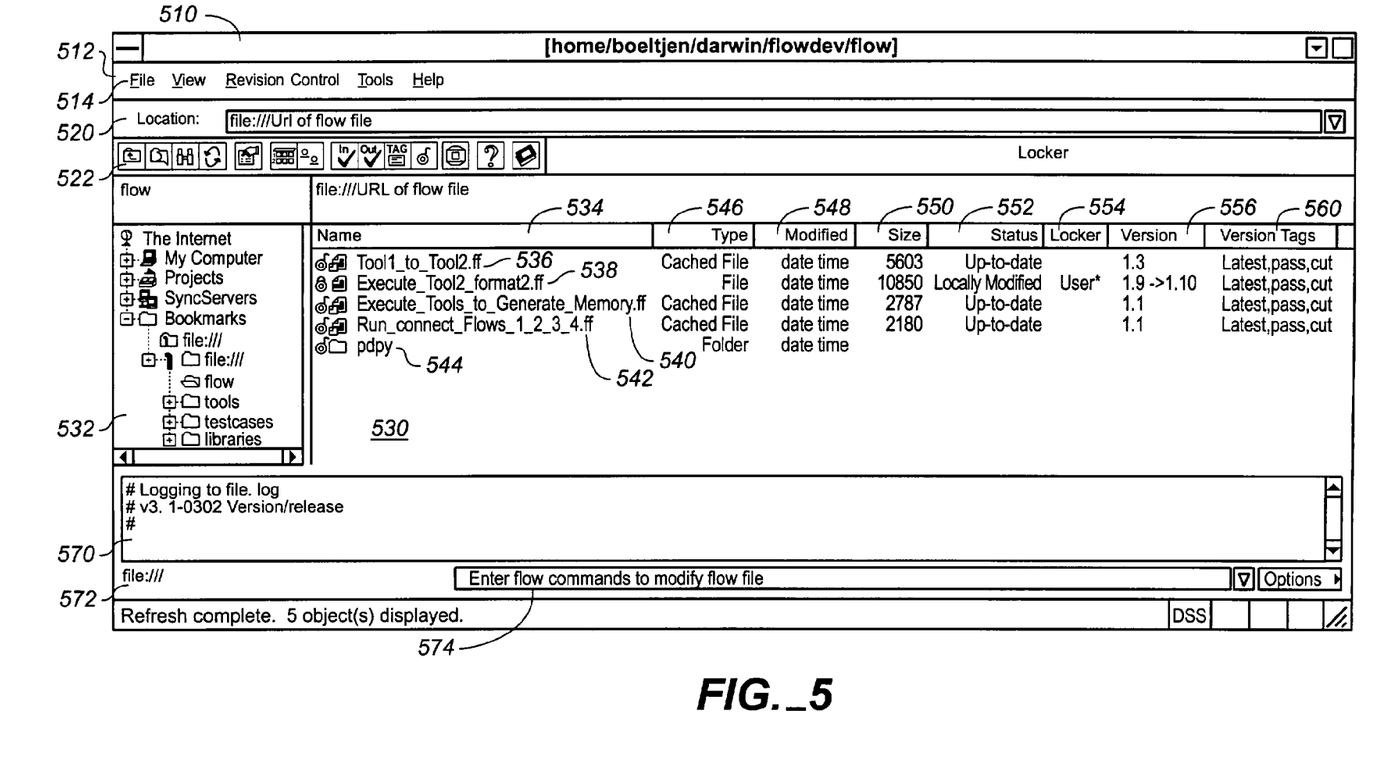
FIG. 5 is a simplified screenshot of how flow files can be displayed on a configuration manager in an embodiment of the flow framework and methodology of the invention.
Figure 7:
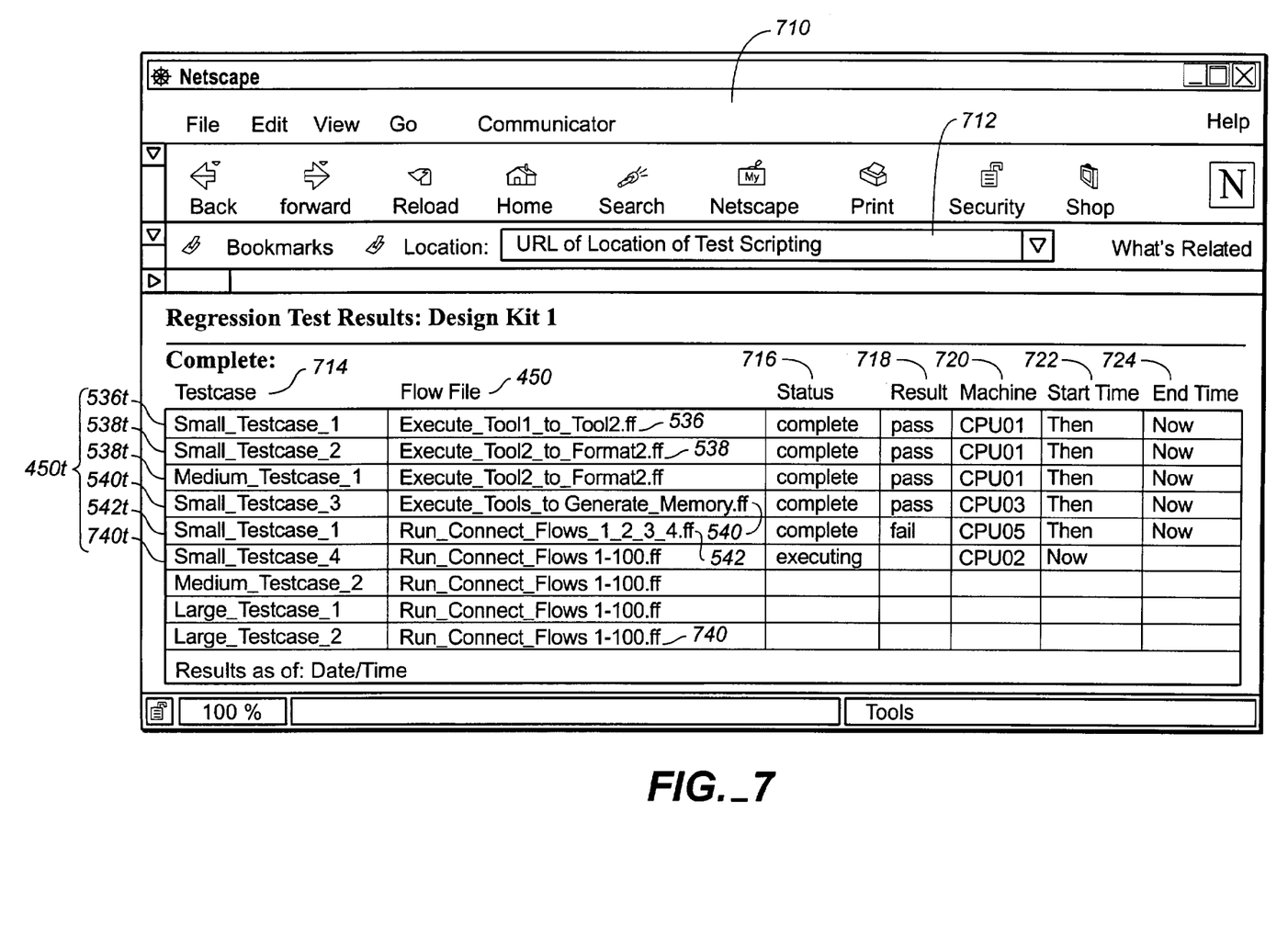
FIG. 7 is a simplified screenshot of a directory in a repository that illustrates the results of regression testing in accordance with an aspect of the flow framework and methodology of the invention.

FIG. 5 is an illustration of a simplified screen shot 500 of how a flow might appear using a web-based configuration manager 440. The screen shot 500 of the configuration manager 440 is simplified in that some extraneous fields have been omitted for clarity and ease of discussion. The first thing to note is that although screen shot 500 is represented as a graphical user interface of a common web browser, especially if the flow framework 350 is connected to multiple users across the Internet, it need not be limited to a graphical user interface. FIGS. 5 and 7 have been presented as graphical user interfaces because this is the environment in which most resource developers work. Given a microprocessor driven device either with no or a limited capability to visually display the user interface, the invention is intended to cover other user interfaces, including but not limited to a more limited graphical user interface, a tactile, or audible or other voice response user interface. But, with a graphical user interface, the title bar 510 has the name of the configuration manager 440, e.g., DesignSync, and the address, preferably the URL, of the resources 442 or the repository 430, or if stored locally, the location of the flow files 450. Below the title and address bar 510 is a typical control bar 512, each having a drop-down menu 514, as is typical of computer applications. Then at window 520, the location of the flow file 450 is repeated. Note the fanciful icons on bar 522 that are typical of a configuration manager and allow a variety of operations on a flow file 450. Two navigable windows 530, 532 are presented. Window 532 displays a file hierarchy of flow files 450 and resources. Window 530 displays a list of the flow files 450 in the repository 430 having the address shown in the address bar 520 that are being accessed by a user. In the example provided in FIG. 5, the names of four flow files are listed in the first column 534: Tool1_To_Tool2.ff 536 which is unlocked as indicated by the icons to the left of the name; Execute_Tool2_Format2.ff 538 which is locked; Execute_Tools_to_Generate_Memory.ff 540, also unlocked; and Run_Connect_Flows_1_2_3_4.ff 542, also unlocked. The file folder pdpy 544 may contain scripts used by the flow files 536–542.

Tool1_To_Tool2.ff 536 is an example of flow that opens a design for a semiconductor chip or portions thereof in a first tool format, perhaps writes a text file, and then translates the design or netlist to a second format for use by a second tool. The flow file Execute_Tool2_Format2.ff 538 may then run the second tool in a second format and may, for example, place and route power and clocks on the design. The third flow, Execute_Tools_to_Generate_Memory.ff 540, may invoke and execute yet other tools, such as disclosed in copending U.S. patent application Ser. No. 10/318,623 entitled Automated Selection and Placement of Memory During Design of an Integrated Circuit, owned by the assignee herein and incorporated by reference in its entirely, to generate memories from standard cells of logic gates during the design of the chip, The fourth flow, Run_Connect_Flows_1_2_3_4.ff 542, may be a higher level flow that connect and run other flows. These flow files are presented by way of example only and those of skill in the art will realize the exemplary nature of the flow files discussed herein. In actuality, there are many more flow files.

Other features of a configuration manager may include the type of file, as in column 546. If a flow file 450 is a "Cached File", it may mean that the flow file 536 is unlocked and multiple users are accessing copies of the flow file; the original flow file, however, is cached. Caching a flow file 450 allows multiple users to access it, is faster, and conserves disk space. The next column 548 may display date and time stamps of the last modification of the flow file; the size of the flow file may be shown, as in column 550. The next column 552 is of interest because it shows the status of the flow file. Note that flow file Execute_Tool2_Format2.ff 538 is locked by a User indicated in column 554 because that user, most likely a flow developer, is modifying the flow file. The version of the flow file is displayed in column 556. Also of interest is column 560 that is a modification of a configuration manager that displays the status tags of the regression testing discussed below. Another window 570 presents a file.log of the flow file that is open to the User. Commands beyond those available in a simplified commercial configuration manager can be entered into window 574.

Returning for a moment to FIG. 4, once the resources 442 which may include flow files 450, testcases 444, tools 446, and libraries 448 are written and stored in the repository 430, additional features of flow framework 350 begin to test the flow 450. Automatic regression testing occurs in the tester 470, which is the third component of the flow framework 350. Unlike the prior art of FIG. 1 in which the methodology documentation must be completed before testing, the flow manager 460 continuously and automatically submits the flow files 450 to the tester 470 as the various developers finish writing their respective resources and submit them to the repository 430. Alternatively, the tester 470 may execute in a batch mode for automatic testing of all the flows at nights and/or weekends. The tester 470 employs regression testing to evaluate new procedures integrated into the system, tests the added functionality to ensure that a new or modified flow file 450 does not corrupt the whole flow. The tester 470, moreover, automatically allocates and distributes the new and/or modified flow files 450, the appropriate testcases 444, and instructions to run the flows to networked computers.

Figure 6:
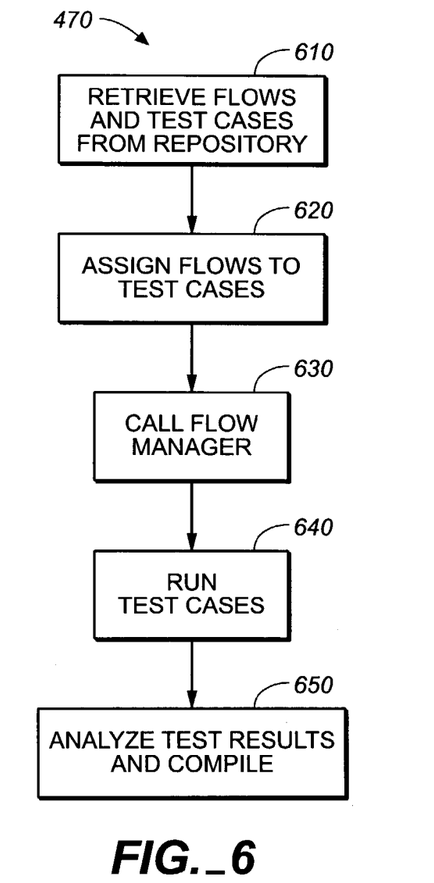
FIG. 6 is a simplified flowchart of an embodiment of the regression testing feature of the flow framework and methodology described herein.

The logic of regression test procedure in the tester 470 is described in the simplified flow chart of FIG. 6. Regression test scripting retrieves flow files 450 and testcases 444 from the repository 420, as in step 610. In step 620, the tester 470 then assigns the testcases 444 and the respective flow files 450 to one or more computers 220 preferably connected across a network 218. Then, at step 630, the tester 470 calls the flow manager 460 to execute the flow files 450 with its testcase(s) 444 at step 640. At step 650, the flow manager 460 returns the status of the tools and the flow files. Multiple layers of checks by the tester 470 ensue as it tracks and tags flow files throughout the testing process. The tester 470 checks for the correction operation of the flow files and the tools; the tester also verifies that the correct data and other information is handed-off from one flow file to another and from one tool to its subsequent tool as specified by the flow files. The tester 470 also checks the quality of the results of the tool operation and execution of the flow files. Did the tool and/or the flow file output the expected design views, i.e., have the expected results been realized and are the results properly located in the log file and the design views? Is the performance of the flow file acceptable; did the test on the flow files run in a reasonable or better than expected time? The tester 470 then returns the compiled and analyzed test results to the flow manager 460 that then reads any status messages. The tester 470 notifies, typically via email or web page, the resource developers 422–428 if their respective resources 442 failed regression testing, and these developers may then debug their respective resources 442. In the meantime, flow files 450 that did pass are logged in the repository 430 and are accessible for release in final design kit 480.

FIG. 7 shows a graphical user interface 710 of a web browser having a directory of testcases for the flow files 450 that have undergone regression testing. Some flows Execute_Tool1_to_Tool2.ff 536, Execute_Tool2_to_Format2.ff 538, and Execute_Tools_to_Generate_Memory.ff 540 passed regression testing as indicated in the column 718; another flow file Run_Connect_Flows_1_2_3_4.ff 542 failed regression testing, and yet another flow file Run_Connect_Flows 1–100.ff 740 is still executing, as indicated in the status column 716. Total test run time of each flow file is presented in columns 722 and 724. Column 720 indicates the computer/workstation upon which the regression testing of a particular flow is executing.

Referring now to FIGS. 4 and 6, and as previously mentioned, the tester 470 automatically logs flow files 450 that fail, and the tester 470 communicates test results automatically via email or a web page or other electronic means, as in step 470 of FIG. 4, to the resource developers 422–428. The resources 442 may then be revised and resubmitted to the flow manager 460 and the tester 470 where it is again distributed for regression testing.

Figure 9:
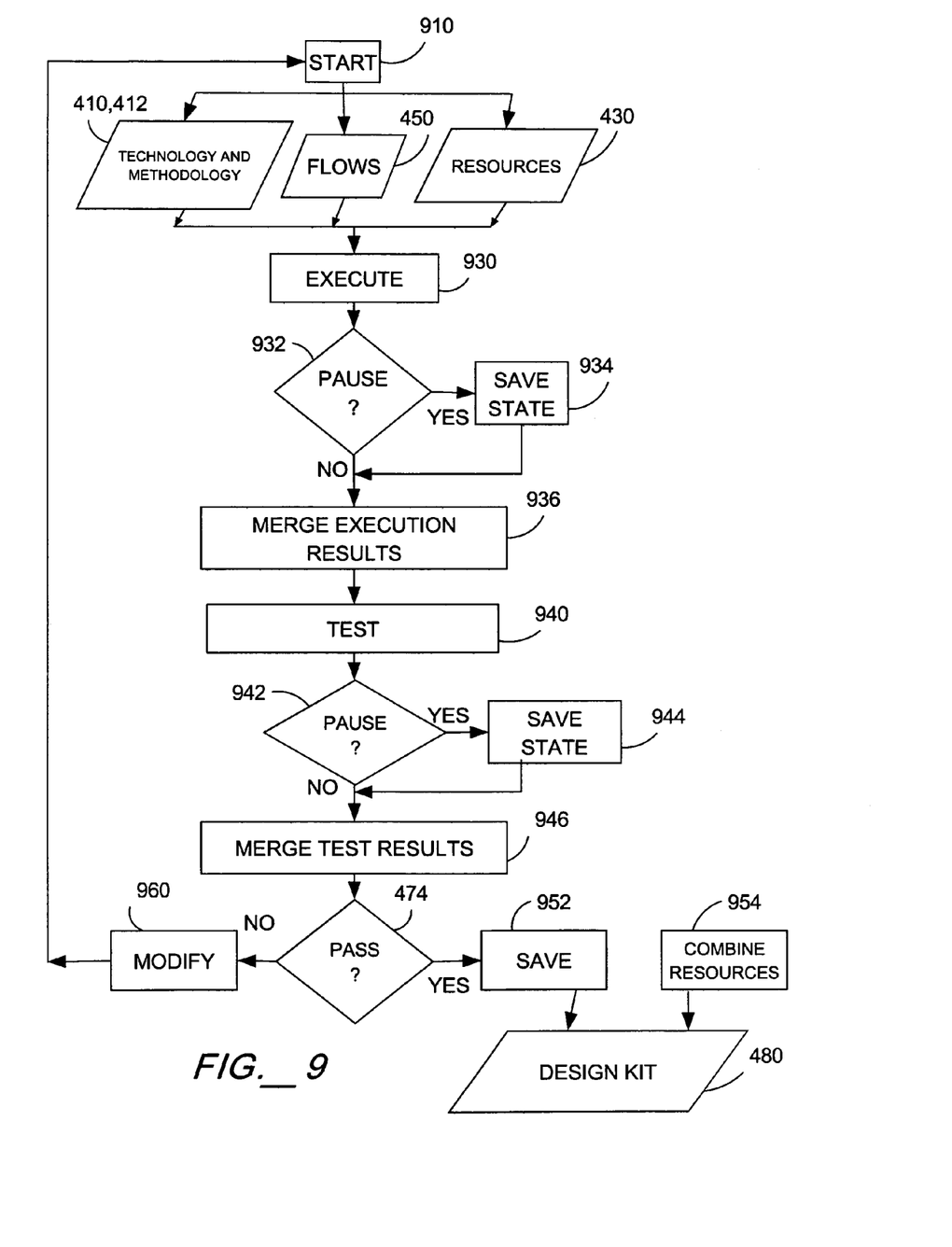
FIG. 9 is a simplified flow chart of the process by which the flow framework and methodology can create a design kit for a semiconductor product in accordance with an embodiment of the invention.

The process of automating the development of flows for the design of semiconductor products is given in a simplified flow chart of FIG. 9. In step 910, the method begins and as shown in 410, 412, the specifications of the technology and the methodology used during the design are input; also input into the process are the resources 430 used for the design of semiconductor products, such as tools, logic and circuit libraries, and testcases. Also input is a sequence of steps to be undertaken to coordinate the interaction of the resources and the specifications, called flows 450. At step 930, the sequence of steps are executed and the execution may pause as in step 932. If execution has been paused, the state of execution is saved as in step 934 for resumption of execution later and mergence of the execution results from amongst multiple processors, as in step 936. At step 940, the sequence of steps are tested; and again at step 942, the testing may be paused. If testing is paused, then at step 944 the state of testing is saved. At step 946, resumption of testing may occur and the mergence of any saved state and from multiple processors occurs. If the sequence of steps does not pass testing as in step 474, then either the resources and/or the sequence of steps are modified and the process passes to start again. If, however, any sequence of steps do pass testing in step 474, then the sequence of steps are saved and the appropriate resources are saved in step 952. When all the sequence of steps have passed testing in step 474, then the saved sequence and correct sequence are combined with the resources to create a design kit at step 480.

Figure 8:
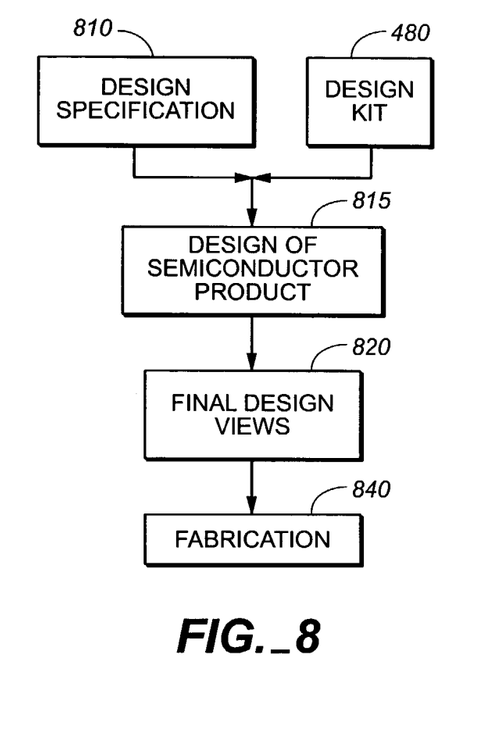
FIG. 8 is a simplified block diagram of how a design kit created using the flow framework and methodology in accordance with an embodiment of the invention can be used to design integrated circuits and chips.

FIG. 8 is a simplified block diagram of how the deliverable design kit may be used with the flow framework for the design of semiconductor product. Input into the flow framework 350 includes the design specification 810. Also input into the flow framework 350 is a design kit 480 comprising the flow manager 460 and the flow files 450, as described above. The flow manager 460 executes the flow files of the design kit and coordinates with the designers and their technology and design specification to output design views 820 that may be qualified netlists having RTL that has passed analysis tests and having verified functionality. The design views will have further passed manufacturing tests that may validate appropriate test patterns using, e.g., JTAG, boundary scan tests of the entire semiconductor product or a portion thereof. Static timing analysis is checked for proper arrival and interval of clock and signal inputs to the logic gates generated during the execution of the various tools. Floor planning and RTL synthesis is provided, as is documentation in the design views 820. It is preferred that the design views 820 can be handed off to a fabrication facility 840 for fabrication of the chip that was created using the design kit as described herein.

Thus, the invention is not intended to be limited to any particular configuration manager or to a particular technology. The specification and drawings are to be regarded as illustrative, rather than restrictive. The invention is further defined by the following claims.

What is claimed is:

1. A method to automate the development of flows for the design of semiconductor products, comprising the steps of:
   (a) inputting a specification of a methodology;
   (b) inputting a plurality of resources used in the design of semiconductor products, the plurality of resources comprising tools, logic and circuit libraries, and testcases for the design of semiconductor products;
   (c) inputting a sequence of steps to be undertaken to coordinate the interaction of the resources and the specification to design semiconductor products;
   (d) executing the sequence of steps;
   (e) testing the sequence of steps;
   (f) saving those sequences of steps that pass testing; and
   (g) combining the resources and the sequence of steps that passed testing into a deliverable design kit for designing semiconductor products.

2. The method of claim 1, further comprising modifying the sequence of steps that fail testing.

3. The method of claim 2, further comprising modifying any of the plurality of resources that result in the sequence of steps failing the testing.

4. The method of claim 1, further comprising saving any of a plurality of states at one of the steps of the sequence during the step of executing and/or the step of testing.

5. The method of claim 4, further comprising pausing the step of executing and/or the step of testing at one of the steps of the sequence.

6. The method of claim 5, further comprising:
   resuming the step of executing and/or the step of testing; and
   restoring any of the plurality of states that were saved during the step of executing and or the step of testing.

7. The method of claim 1, wherein the step of executing the sequence of steps is allocated to multiple processors.

8. The method of claim 7, wherein a plurality of results of the step of executing the sequence of steps allocated to multiple processors are merged.

9. The method of claim 1, wherein the step of testing the sequence of steps is allocated to multiple processors.

10. The method of claim 9, wherein a plurality of results of said step of testing allocated to multiple processors are merged to determine if said sequence of steps passed testing.

11. A method to automate the development of flows for the design of semiconductor products, comprising the steps of:
- (a) inputting a specification of a methodology;
- (b) inputting a plurality of tools used in the design of semiconductor products;
- (c) inputting at least one library of logic used in the design of semiconductor products;
- (d) inputting a hierarchy of testeases used in the design of semiconductor products, the testeases increasing in complexity and coverage of the function and area of the semiconductor products;
- (e) inputting a sequence of steps to be undertaken to coordinate the interaction of the resources and the specification for the design of semiconductor products;
- (f) executing different portions of the sequence of steps on different multiple processors;
- (g) testing different portions of the sequence of steps on different multiple processors;
- (h) merging the results of the executing and of testing different portions of the sequence of steps on different multiple processors;
- (i) saving those sequences of steps that pass testing;
- (j) pausing the step of executing and/or the step of testing, and saving any of a plurality of states at one of the steps of the sequence during the step of executing and/or the step of testing wherein the sequence of steps failed executing and/or failed testing;
- (k) modifying the sequence of steps that fail testing;
- (l) modifying any of the plurality of testcases and/or libraries, and/or tools that failed the testing;
- (m) resuming the step of executing and/or the step of testing; and
- (n) restoring any of the plurality of states that were saved during the step of executing and/or the step of testing; and
- (o) combining the sequence of steps that passed and the resources into a deliverable design kit used to design semiconductor products.

* * * * *